United States Patent
Jang et al.

(10) Patent No.: US 6,853,040 B2
(45) Date of Patent: Feb. 8, 2005

(54) MOS TRANSISTOR AND FABRICATION METHOD THEREOF

(75) Inventors: Kyung-Oun Jang, Incheon (KR); Sun-Hak Lee, Kyungki-do (KR)

(73) Assignee: Fairchild Korea Semiconductor Ltd., Bucheon (KR)

(*) Notice: Subject to any disclaimer, the term of this patent is extended or adjusted under 35 U.S.C. 154(b) by 110 days.

(21) Appl. No.: 10/300,293

(22) Filed: Nov. 20, 2002

(65) Prior Publication Data

US 2003/0071314 A1 Apr. 17, 2003

Related U.S. Application Data

(62) Division of application No. 09/761,902, filed on Jan. 17, 2001, now Pat. No. 6,507,080.

(30) Foreign Application Priority Data

Jan. 17, 2000 (KR) .......................................... 2000-2023

(51) Int. Cl.[7] .............................................. H01L 29/76
(52) U.S. Cl. ...................... 257/409; 257/335; 257/362; 257/375; 257/401
(58) Field of Search ................................ 257/489, 335, 257/362, 375, 401

(56) References Cited

U.S. PATENT DOCUMENTS

| | | | | |
|---|---|---|---|---|
| 4,047,217 A | * | 9/1977 | McCaffrey et al. | ......... 257/592 |
| 4,529,456 A | * | 7/1985 | Anzai et al. | ................. 438/234 |
| 4,628,341 A | * | 12/1986 | Thomas | ...................... 257/338 |
| 4,662,057 A | * | 5/1987 | Yasuoka et al. | ............ 438/207 |
| 5,017,996 A | * | 5/1991 | Yasuoka | ..................... 257/370 |
| 5,844,275 A | | 12/1998 | Kitamura et al. | |
| 6,093,620 A | | 7/2000 | Peltzer | |
| 6,376,891 B1 | * | 4/2002 | Nagatani et al. | ............ 257/492 |

* cited by examiner

Primary Examiner—Allan R. Wilson
Assistant Examiner—Edgardo Ortiz
(74) Attorney, Agent, or Firm—Alston & Bird LLP

(57) ABSTRACT

A CMOS transistor is provided having a relatively high breakdown voltage. The CMOS transistor includes an N-type epitaxial layer on a P-type substrate. Between the substrate and epitaxial layer are a heavily doped N-type buried layer and a heavily doped P-type base layer. An N-type sink region is proximate the edge of the NMOS region, and twin wells are in the area surrounded with the sink region. N+ source and drain regions are formed in respective wells. As the sink region is interposed between the drain and isolation regions, a breakdown occurs between the sink and isolation regions when a high voltage is applied. Twin wells are also formed in the PMOS region. P+ source and drain regions are formed in respective wells. As the N-type well surrounds the source and bulk regions, a breakdown occurs between a buried region and the isolation region when a high voltage is applied.

6 Claims, 9 Drawing Sheets

US 6,853,040 B2

MOS TRANSISTOR AND FABRICATION METHOD THEREOF

CROSS-REFERENCE TO RELATED APPLICATIONS

This application is a divisional of U.S. application Ser. No. 09/761,902, filed Jan. 17, 2001 now U.S. Pat. No. 6,507,080, which claims priority from Korean Patent Application No. 2000-2023, filed Jan. 17, 2000, both of which are hereby incorporated herein in their entirety by reference.

BACKGROUND OF THE INVENTION

1. Field of the Invention

The present invention relates to a metal-oxide-semiconductor (MOS) transistor and, more specifically, to a complementary MOS (CMOS) transistor, such as for a power switch.

2. Description of the Related Art

MOS transistors and, more particularly, CMOS transistors are utlizied for a variety of applications, including power switches. In fact, one of the most fundamental factors of a power integrated circuit is a bridge circuit, in which pull-up and pull-down transistors selectively switch a load node in the opposite directions to each other. The related general structure is an H-bridge circuit where two points connected to the load are connected to a half-bridge circuit. The half-bridge circuit is used particularly in the control of a motor because the current is driven in either of the two opposite directions. Generally, a power integrated circuit includes an N-channel power field effect transistor (FET), for example a VDMOS device, in the driver circuit. Use is typically made of a MOS transistor, e.g., a complementary MOS transistor, for the power switch for the driver circuit of a power FET, especially a high-side driver.

MOS transistors, including CMOS transistors, preferably have a high breakdown voltage and resist parasitic operation. For example, the complementary MOS transistor used for the high-side driver must have a sufficiently high breakdown voltage and avoid parasitic operation to provide proper switching.

SUMMARY OF THE INVENTION

It is an object of the present invention to increase the withstand voltage of a MOS transistor.

It is another object of the present invention to prevent the parasitic operation of the MOS transistor.

The present invention therefore employs a twin-well structure in order to increase the withstand voltage of the MOS transistor and has a sink region to prevent parasitic operation. In one aspect of the present invention, there is provided a MOS transistor including a semiconductor layer; first and second wells of different conductivity types formed in the semiconductor layer; source and drain regions formed in the first and second wells, respectively; and a gate formed on the semiconductor layer.

The MOS transistor of this aspect of the present invention can further include a sink region formed in the semiconductor layer and surrounding the first and second wells, and an isolation layer formed in the semiconductor layer and disposed opposite to the first and second wells with respect to the sink region.

Preferably, the respective junction depths of the first and second wells are different from each other.

In another aspect of the present invention, there is provided a MOS transistor including a semiconductor substrate of a first conductivity type; a semiconductor layer of a second conductivity type formed on the semiconductor substrate; a sink region of the second conductivity type formed in the semiconductor layer and heavily doped relative to the semiconductor layer; source and drain regions formed in the semiconductor layer and surrounded with the sink region; and a gate formed on the semiconductor layer.

The MOS transistor of this aspect of the present invention can further include a buried layer of the second conductivity type formed between the semiconductor substrate and the semiconductor layer and heavily doped relative to the semiconductor layer. First and second wells of different conductivity types are formed in the semiconductor layer and include the source and drain regions, respectively. Preferably, the source and drain regions have the second conductivity type, and the first and second wells have the first and second conductivity types, respectively. The MOS transistor further of this aspect of the present invention can also include a bulk region formed in the first well and having the same conductivity type as the first well.

A method for fabricating such a MOS transistor is also provided that includes the steps of forming a buried layer of a second conductivity type and a base layer of a first conductivity type on a semiconductor substrate of the first conductivity type; growing a semiconductor layer on the semiconductor substrate; forming a sink region of the second conductivity type in a portion of the semiconductor layer; forming a first well of the first conductivity type in a portion of the semiconductor layer overlying the buried layer and a first isolation region of the first conductivity type in a portion of the semiconductor layer overlying the base layer; forming a second well of the second conductivity type in a portion of the semiconductor layer; forming a gate oxide layer and a gate electrode on the semiconductor layer; and forming source and drain regions in the first and second wells, respectively.

BRIEF DESCRIPTION OF THE DRAWINGS

The accompanying drawings, which are incorporated in and constitute a part of the specification, illustrate an embodiment of the invention, and, together with the description, serve to explain the principles of the invention.

DETAILED DESCRIPTION OF THE PREFERRED EMBODIMENTS

In the following detailed description, only the preferred embodiment of the invention has been shown and described, simply by way of illustration of the best mode contemplated by the inventor(s) of carrying out the invention. As will be realized, the invention is capable of modification in various obvious respects, all without departing from the invention. Accordingly, the drawings and description are to be regarded as illustrative in nature, and not restrictive.

Now, a description will be given in detail as to a half-bridge circuit according to an embodiment of the present invention with reference to FIG. 1.

Figure 1:
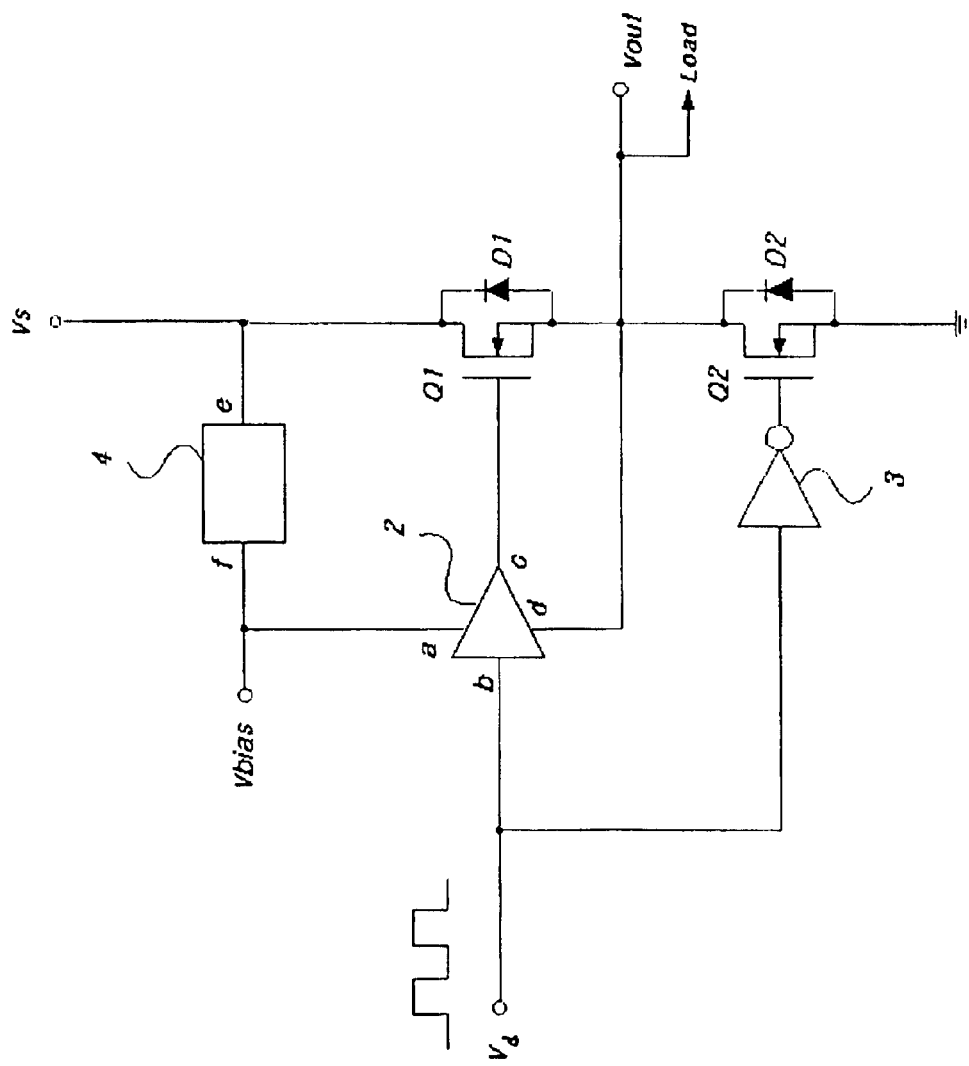
FIG. 1 is an equivalent circuit diagram showing a half-bridge circuit according to an embodiment of the present invention.

As shown in FIG. 1, a PMOS transistor Q1 for high-side power is connected in series to a PMOS transistor Q2 for low-side power, i.e., the drain of the high-side transistor Q1 is connected to the source of the low-side transistor Q2. The power transistor as used herein is, for example, a VDMOS transistor. Both terminals of the individual transistors Q1 and Q2 are connected to free wheeling diodes D1 and D2, respectively. The cathode of the diodes D1 and D2 are connected to the sources of the transistors Q1 and Q2, and the anodes of the diodes D1 and D2 are connected to the drains of the transistors Q1 and Q2. The source of the high-side transistor Q1 is connected to a source voltage $V_s$, and the drain of the low-side transistor Q2 is grounded. The gate of the high-side transistor Q1 is connected to the output "c" of a high-side driver 2, and the gate of the low-side transistor Q2 is connected to the output of a low-side driver 3, which is comprised of an inverter. The control terminal "b" of the high-side, driver 2 is connected to an externally applied direction signal $V_d$, and the input "a" of the high-side driver 2 is connected to the output "f" of a charge pump 4. A second output "d" of the high-side driver 2 is connected to the drain of the high-side transistor Q1 and the source of the low-side transistor Q2 to form the output of the half-bridge circuit, which is connected to a load such as a spindle motor.

Figure 2:
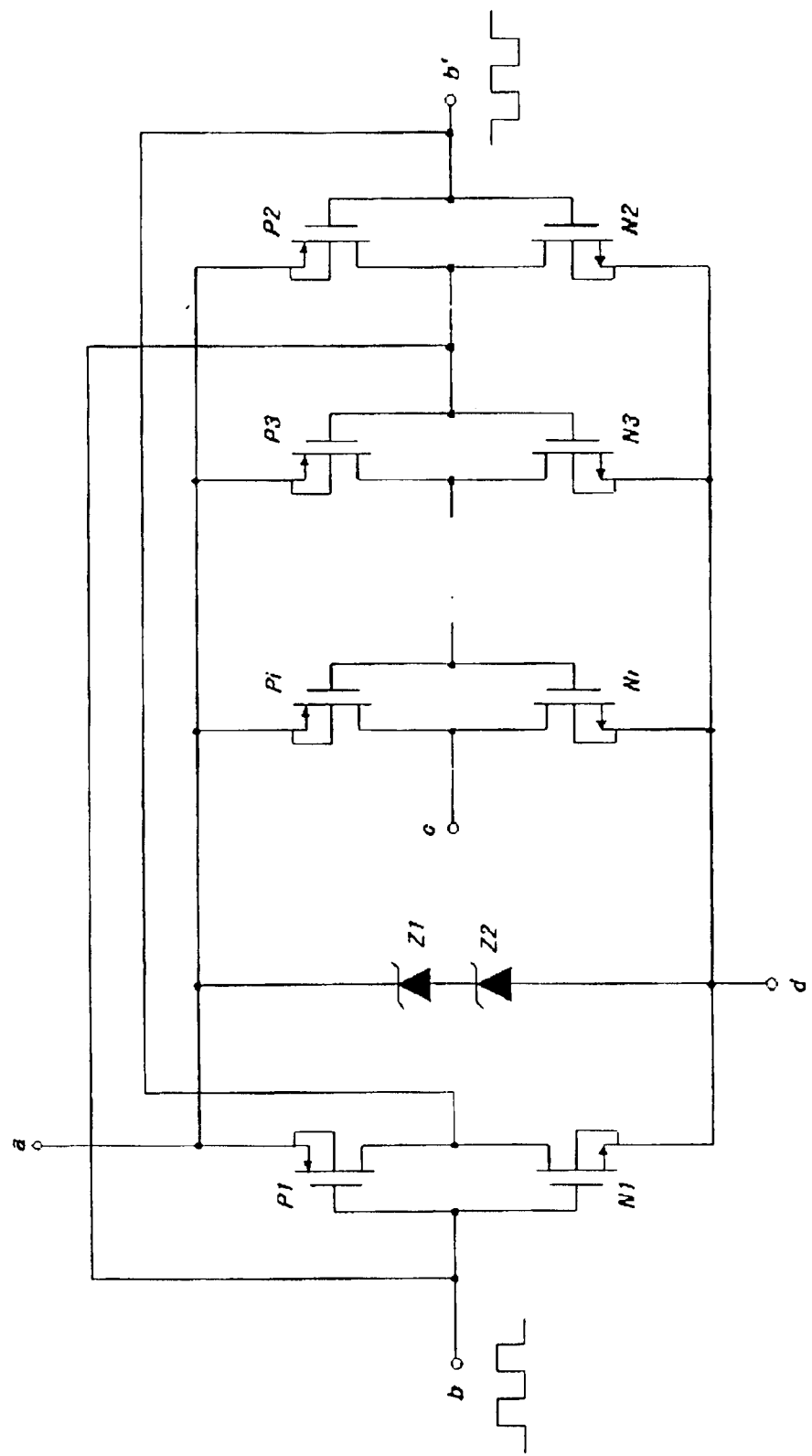
FIG. 2 is an equivalent circuit diagram showing a high-side driver according to an embodiment of the present invention.

The high-side driver 2 of FIG. 1 has a structure as shown in FIG. 2, in which the high-side driver 2 has multi-staged CMOS transistors P1-N1, P2-N2, P3-N3, . . . , Pi-Ni and a pair of diodes Z1 and Z2.

Each CMOS transistor comprises PMOS transistors P1, P2, P3, . . . , Pi and NMOS transistors N1, N2, N3, . . . , Ni. In the individual CMOS transistors, the gates of the PMOS transistors P1, P2, P3, . . . , Pi are connected to those of the NMOS transistors N1, N2, N3, . . . , Ni to form a control terminal, and the sources of the PMOS transistors P1, P2, P3, . . . , Pi are connected to the drains of the NMOS transistors N1, N2, N3, . . . , Ni to form a first output. The drains of the PMOS transistors P1, P2, P3, . . . , Pi form an input, and the sources of the NMOS transistors N1, N2, N3, . . . , Ni form a second output. The inputs of the CMOS transistors P1-N1, P2-N2, P3-N3, . . . , Pi-Ni in each stage are interconnected to form an input "a" of the high-side driver 2. The second outputs of the CMOS transistors P1-N1, P2-N2, P3-N3, . . . , Pi-Ni in each stage are interconnected to form an output "d" of the high-side driver 2.

The control terminal of the CMOS transistors P2-N2, P3-N3, . . . in the individual stages other than the first and final stages (P1-N1 and Pi-Ni) is connected to the first output of the CMOS transistor in the previous stage.

The control terminal of the CMOS transistor P1-N1 in the first stage on the utmost left side of the figure is connected to the control terminal "b" of the high-side driver 2 to receive an external direction signal, and the first output of the CMOS transistor P1-N1 is connected to the terminal "b" as well as the control terminal of the CMOS transistor P2-N2 in the second stage on the utmost right side of the figure. The control terminal of the CMOS transistor P3-N3 in the third stage is connected to the control terminal "b" of the high-side driver 2 as well as the first output of the CMOS transistor P2-N2 in the second stage. The first output of the CMOS transistor Pi-Ni in the final stage is connected to the output "c" of the high-side driver 2.

A pair of Zener diodes Z1 and Z2 are connected in series to both terminals of each CMOS transistor, i.e., the drain terminal of the PMOS transistor and the source terminal of the NMOS transistor, in order to minimize the resistance of the high- and low-side transistors Q1 and Q2 and clamp the operational range of the CMOS transistor.

In this half-bridge circuit, the charge pump 4, which typically includes a diode and a capacitor for raising a voltage as known to those skilled in the art, receives a source voltage $V_s$ to generate a bias voltage $V_{bias}$ of an appropriate level. The bias voltage $V_{bias}$ is varied depending on the voltage $V_{out}$ of the output "d" and has a value obtained by adding $2V_z$, i.e, the voltage drop across both terminals of the Zener diodes Z1 and Z2, to the voltage of the output "d". The voltage of the output "c" of the high-side driver 2 keeps a value of $V_{bias}$ when the direction signal applied to the control terminal "b" is HIGH, and a value of $V_{bias}-2V_z$ when the direction signal is LOW. The high-side transistor Q1 is switched OFF to interrupt the current when a voltage $V_{bias}$ is applied to the gate of the high-side transistor Q1; or the high-side transistor Q2 is switched ON to let the current flow when a voltage $V_{bias}-2V_z$ is applied to the gate. The low-side driver 3, which is an inverter, outputs a low signal when the direction signal is HIGH, and outputs a high signal when the direction signal is LOW. The low-side transistor Q2 is switched ON to let the current flow when the direction signal is HIGH; or the low-side transistor is switched OFF to let the current flow when the direction signal is LOW. Therefore, the high-side transistor Q1 and the low-side transistor Q2 alternately let the current flow based on the direction signal.

Now, a description will be given in detail as to the structure of the CMOS transistor constituting the high-side driver 2 with reference to FIG. 3.

Figure 3:
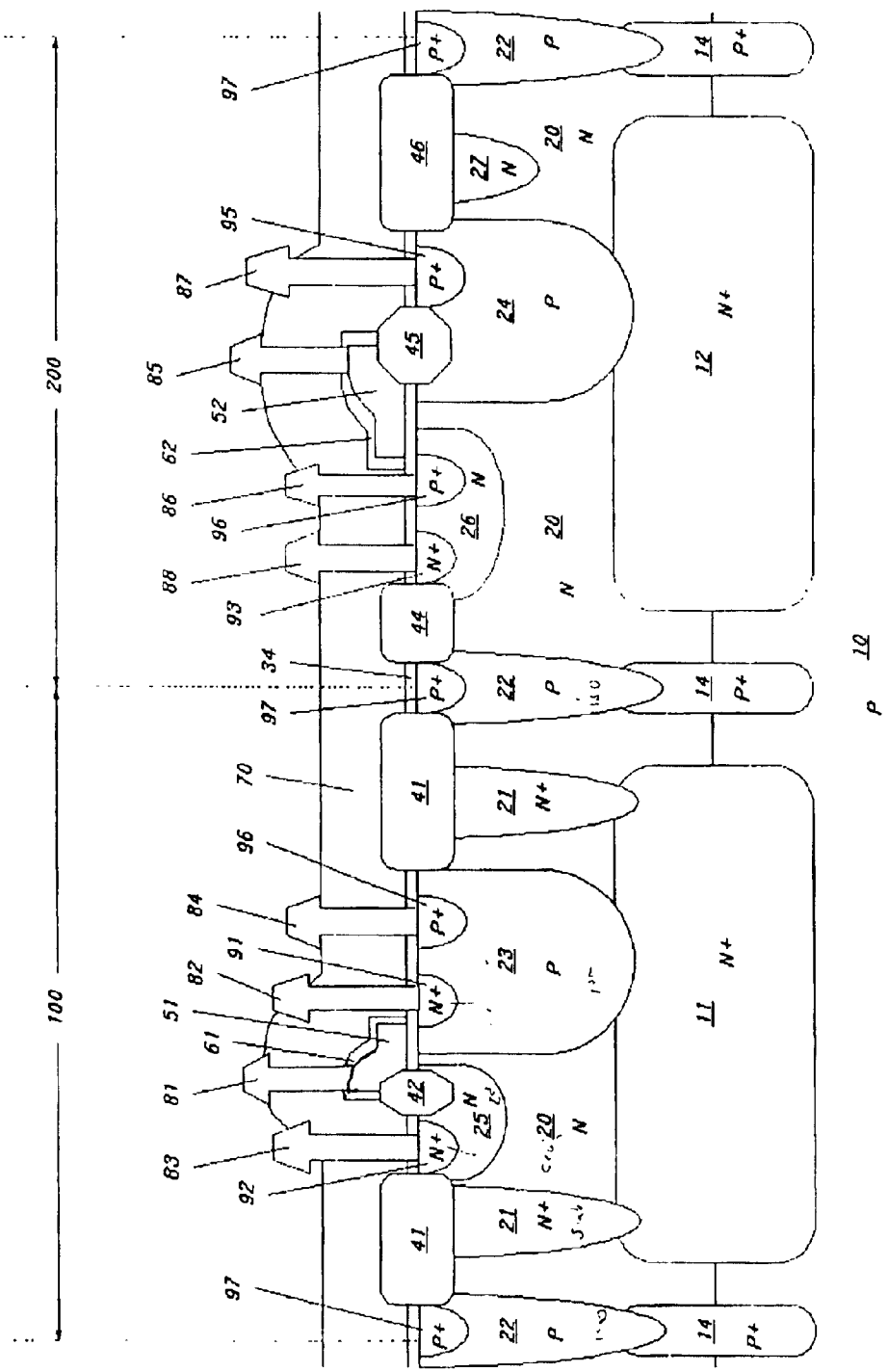
FIG. 3 is a cross-sectional view of a CMOS transistor according to an embodiment of the present invention.

FIG. 3 is a cross-sectional view of the CMOS transistor according to an embodiment of the present invention. Expediently, the CMOS transistor is divided into an NMOS region 100 for NMOS transistors, and a PMOS region 200 for PMOS transistors. In this embodiment, the CMOS transistor includes an N-type sink region 21 at the edge of the NMOS region 100 in order to prevent parasitic operation of the NMOS transistors, and has a twin-well structure to maintain a high withstand voltage.

As illustrated in FIG. 3, an N-type epitaxial layer 20 is formed on a P-type substrate 10.

Between the substrate 10 and the epitaxial layer 20 are formed a plurality of diffused areas 11, 12 and 14. Heavily doped N-type buried layers 11 and 12 are respectively disposed in the NMOS region 100 and the PMOS region 200, at the boundary of which is formed a heavily doped P-type base layer 14. The buried layers 11 and 12 isolate various diffused regions to be formed in the epitaxial layer 20 from the substrate 10 and prevent the regions from being grounded.

The epitaxial layer 20 also has a plurality of diffused regions 21, 22, 23, 24, 25, 26, 27, 91, 92, 93, 94, 95, 96 and 97 formed therein and described in more detail hereinafter.

First, an N-type sink region 21 in contact with the buried layer 11 is formed in the vicinity of the edge of the NMOS region 11, and twin wells, i.e., an N-type well 25 and a P-type well 23, are formed in the area surrounded by the sink region 21. The twin wells are different in junction depth from each other in order to reinforce the latch, which is the weakness of the CMOS transistor. In the figure, for example, the junction depth of the P-type well 23 is larger than that of the N-type well 25 so that the P-type well 23 is in contact with the buried layer 11. An N+ source region 91 and a P+ bulk region 96 are formed in the P-type well 23, and an N+ drain region 92 is formed in the N-type well 25. The heavily doped sink region 21 is interposed between the drain region 92 and isolation regions 14, 22 and 97, so that when a high voltage is applied, a breakdown occurs not between the drain region 92 and the isolation regions 14, 22 and 97 but between the sink region 21 and the isolation regions 14, 22 and 97, with a relatively high breakdown voltage.

In the PMOS region 200, two N-type wells 26 and 27 and a P-type well 24 are formed. As in the NMOS region 100, the junction depth of the P-type well 24 is larger than those of the N-type wells 26 and 27 so that the P-type well 24 is in contact with the buried layer 12. A P+ source region 94 and an N+ bulk region 93 are formed in the N-type well 26, and a P+ drain region 95 is formed in the P-type well 24. The N-type well 26 surrounds the source region 94 and the bulk region 93, so that when a high voltage is applied, a breakdown occurs between the heavily doped buried layer 12 and the isolation regions 14, 22 and 97, with a relatively high breakdown voltage.

In several portions of the epitaxial layer 20, device-isolating oxide layers 41, 42, 44, 45 and 46 are formed, between which is formed a thin gate oxide layer 34. In particular, an oxide layer 41 is disposed on the sink region 21 of the NMOS region 100 and on portions of the epitaxial layer between the sink region 21 and the second isolation region 97 and between the sink region 21 and the the drain region 92 adjacent to the sink region 21. An oxide layer 42 is disposed on a portion of the N-type well 25 other than at the drain region 92. An oxide layer 44 is disposed between the bulk region 93 and the second isolation region 97 in the PMOS region 200. An oxide layer 45 is disposed on a portion of the P-type well 24 other than at the drain region 95. An oxide layer 46 is disposed on the N-type well 27 and on portions of the epitaxial layer between the N-type well 27 and the second isolation region 97 and between the N-type well 27 and the drain region 95 adjacent to the N-type well 27.

On the gate oxide layer 34 are formed gate electrodes 51 and 52 and oxide layers 61 and 52, which cover the gate electrodes 51 and 52, respectively. The gate electrodes 51 and 52 are disposed between the source regions 91 and 94 and the drain regions 92 and 95 in the NMOS and PMOS regions 100 and 200, respectively, and cover part of the device-isolating oxide layers 42 and 45.

The device-isolating oxide layers 41, 42, 44, 45 and 46, the gate oxide layer 34 and the oxide layers 61 and 62 are covered with an insulating layer 70. The insulating layer 70 has a contact hole which extends through portions of the oxide layers 61 and 62 to expose the gate electrodes 51 and 52, and a second contact hole which extends through portions of the gate oxide layer 34 to expose the source regions 91 and 94, the drain regions 92 and 95 and the bulk regions 96 and 93.

On the insulating layer 70 is formed gate electrodes 81 and 85, source electrodes 82 and 86, drain electrodes 83 and 87, and bulk electrodes 84 and 88, which are connected to the gate electrodes 51 and 52, the source regions 91 and 94, the drain regions 92 and 95, and bulk regions 96 and 93, respectively, via the contact holes.

The breakdown voltage between the NMOS and PMOS transistors is a medium voltage of 15 V, and the NMOS and PMOS transistors have a threshold voltage of 0.75–0.95 V and 0.7–0.9 V, respectively. Preferably, the gate oxide layer 34 has a small thickness, such as 400 angstroms, in order to obtain such threshold voltages. It is also preferable to separate the sink region 21 from the isolation regions 14, 22 and 97, or the buried layers 11 and 12 from the base layer 14 by a sufficiently large distance because the breakdown voltage between the source and drain regions 91, 92, 94 and 95 of the PMOS and NMOS transistors and the isolation regions 14, 22, 97 has to be higher than the voltage $V_{out}$ of the output "d". The sink region 21 is designed to prevent the parasitic operation of the NMOS transistor. Also, the P-type wells 23 and 24, and the first isolation region 22 are designed to maintain a high withstand voltage of each transistor.

Now, a description will be given in detail as to a method for fabricating the CMOS transistor shown in FIG. 3 with reference to FIGS. 4a to 4f.

Figure 4A:
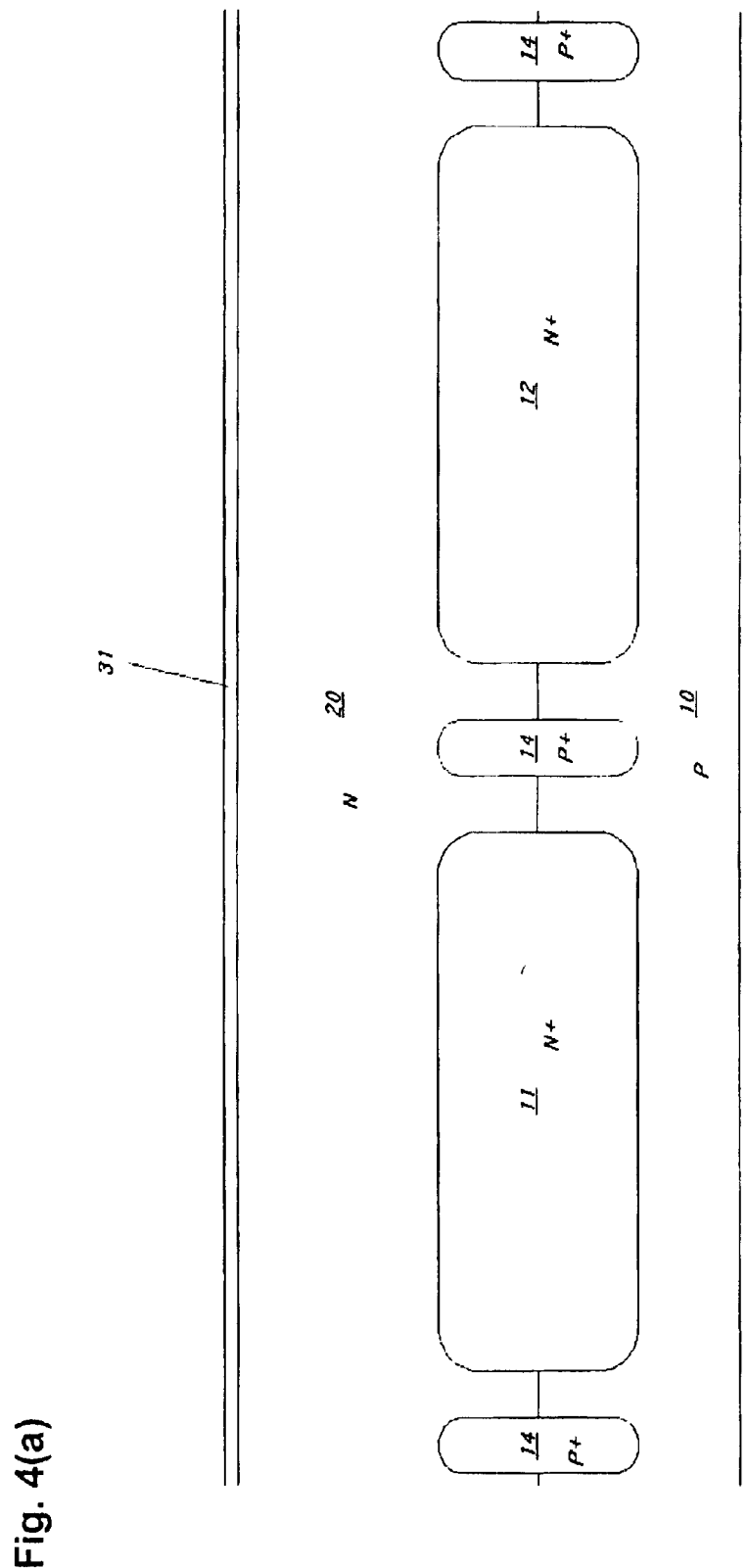
FIGS. 4a to 4f are cross-sectional views showing a process for fabricating a CMOS transistor according to an embodiment of the present invention.

As shown in FIG. 4a, N-type buried layers 11 and 12 and a P-type base layer 14 are formed on a P-type substrate 10, and an N-type epitaxial layer 20 is grown in the thickness range of about 5 to 15 $\mu$m. On the epitaxial layer 20 is formed a thin thermal oxide layer 31.

Figure 4B:
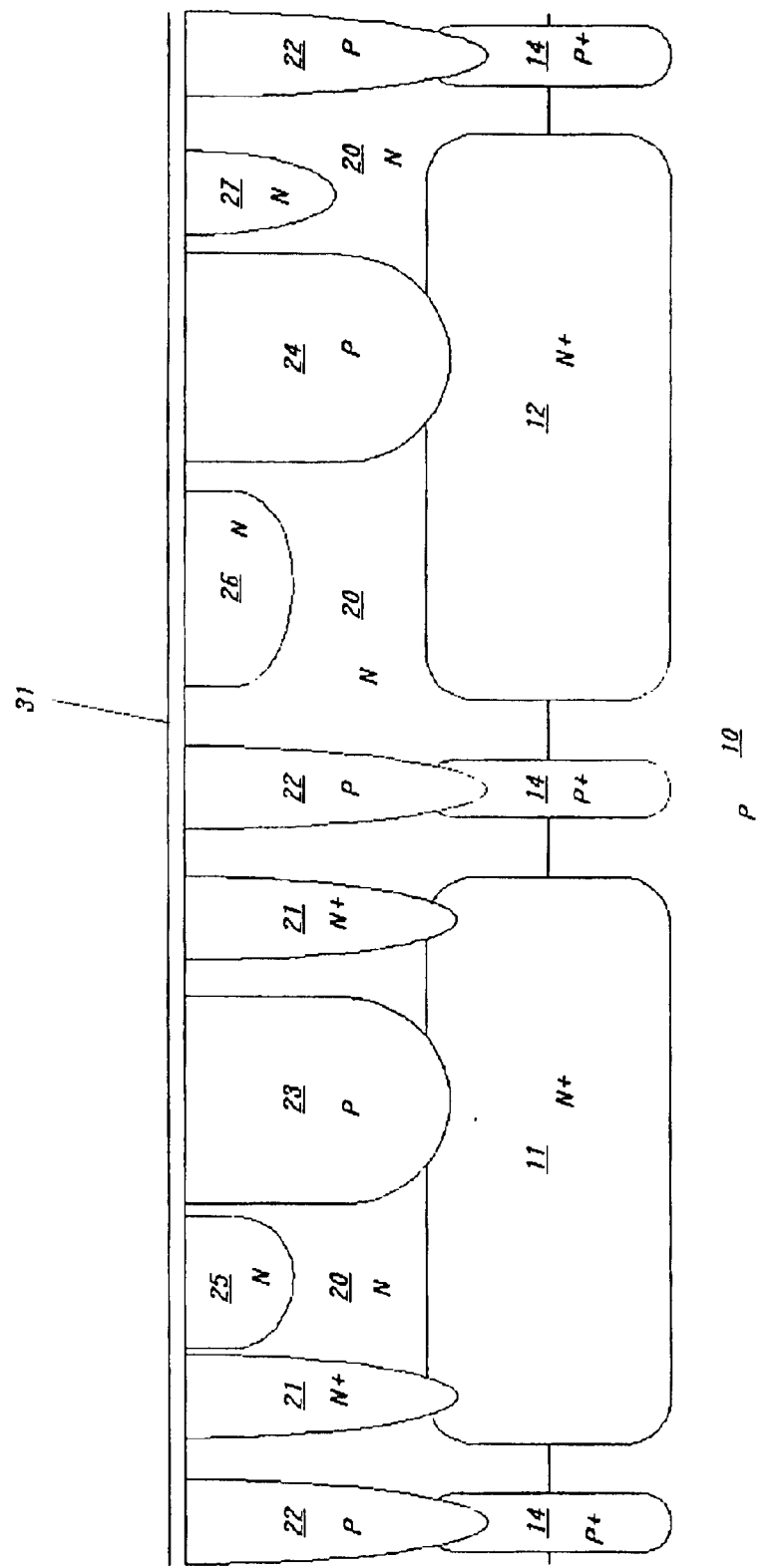

As shown in FIG. 4b, the epitaxial layer 20 is doped with N-type ions to form an N-type sink region 22 and with P-type ions to form a first P-type isolation region 22 and P-type wells 23 and 24. Then, N-type wells 25, 26 and 27 are produced in the epitaxial layer 20 by an N-type ion implantation at a dosage of $5 \times 10^{11}$ to $1 \times 10^{13}$ atoms/cm$^2$.

Figure 4C:
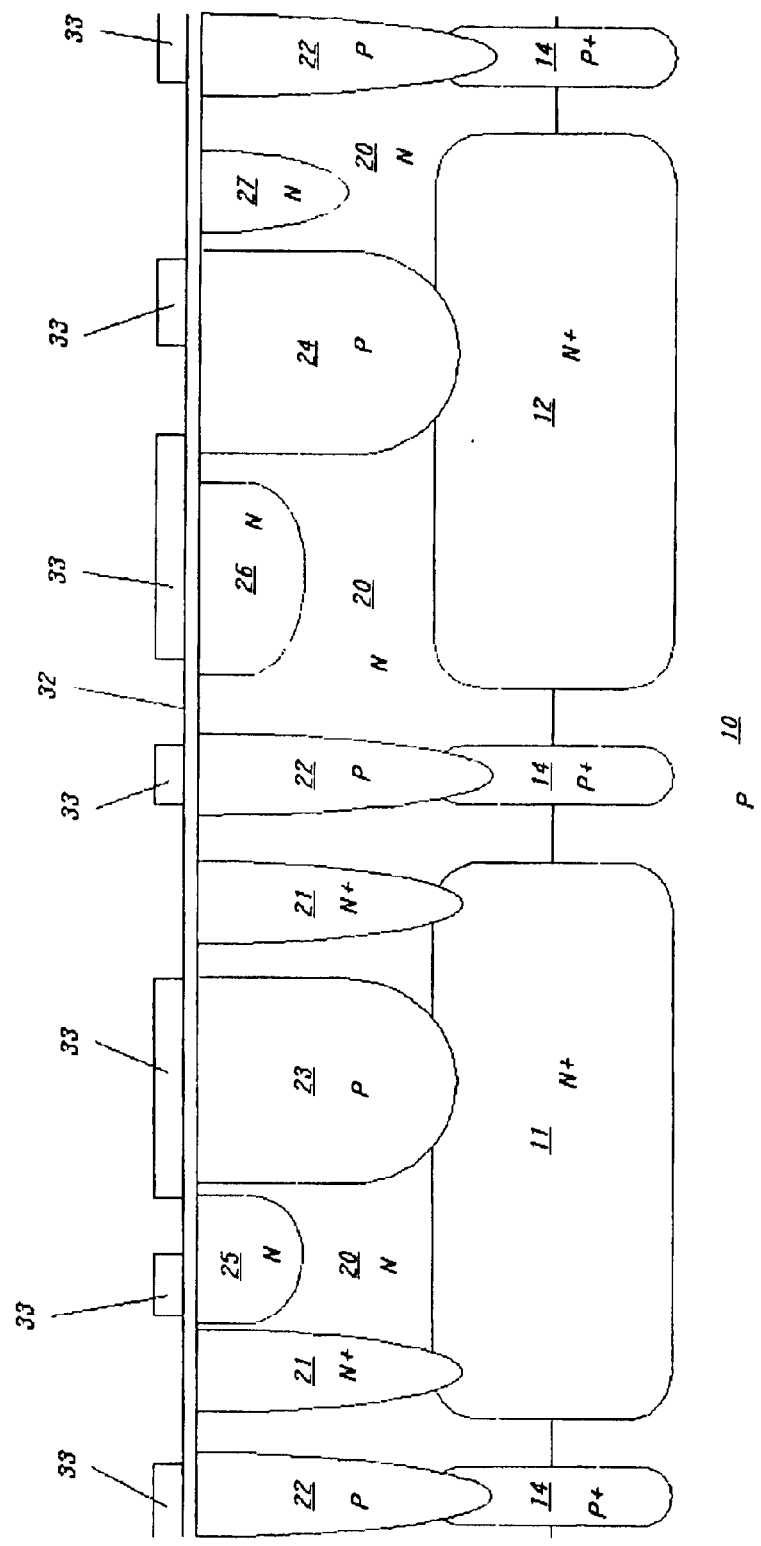

As shown in FIG. 4c, after removal of the thermal oxide layer 31, a thin oxide layer in the thickness range of 100 to 1,000 Å and a nitride layer 33 in the thickness range of 500 to 2,000 Å are sequentially deposited on the epitaxial layer 20. The nitride layer 33 is then patterned to form a plurality of openings.

Figure 4D:
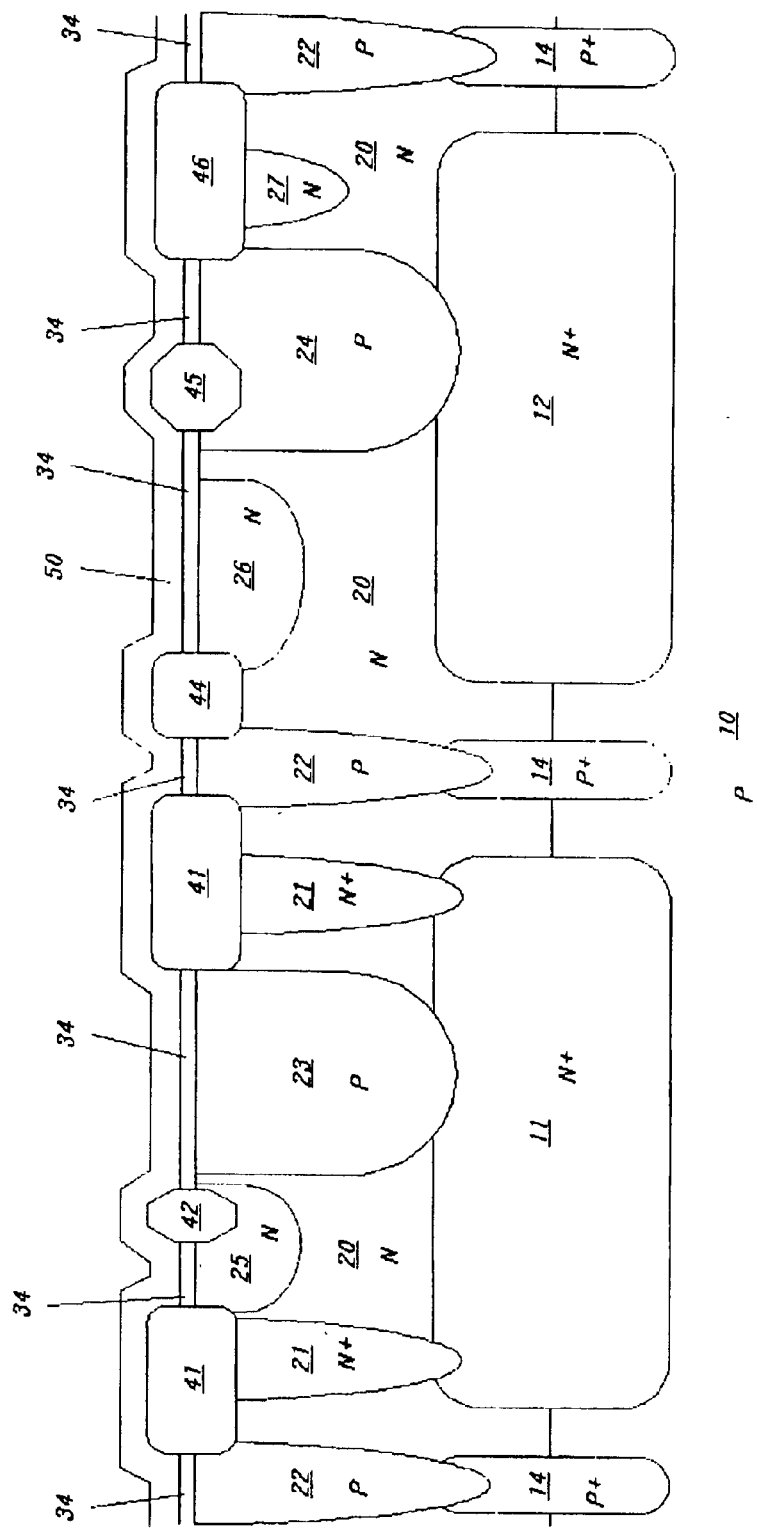

As shown in FIG. 4d, thermal oxidation is conducted on the openings to form thick oxide layers 41, 42, 44, 45 and 46 in the thickness range of 2,000 to 10,000 Å, after which the nitride layer 33 and the thin oxide layer 32 are removed. Subsequently, a second thermal oxidation is conducted to form a thick gate oxide layer 34 in the thickness range of 100 to 1,000 Å on the surface of the epitaxial layer 20 between the thick oxide layers 41, 42, 44, 45 and 46. A polysilicon layer 50 is then deposited on the oxide layers 34, 41, 42, 43, 44, 45, 46, 47 and 48.

Figure 4E:
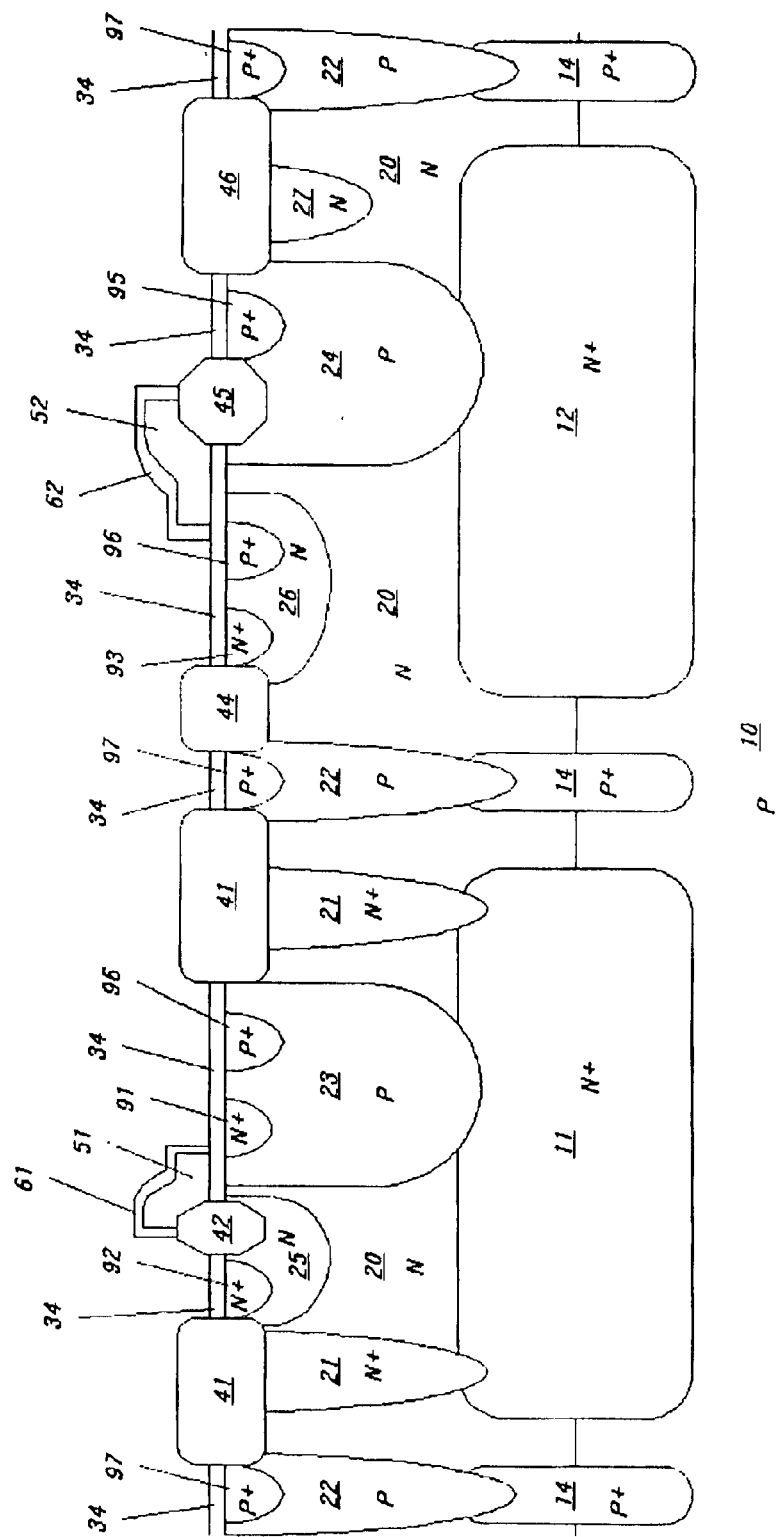

As shown in FIG. 4e, the polysilicon layer 50 is etched to form gate electrodes 51 and 52. An N-type ion implantation is conducted on the epitaxial layer 20 at a dosage of $5 \times 10^{14}$ to $1 \times 10^{16}$ atoms/cm$^2$ to form source and drain regions 94 and 95 of the PMOS transistor and a bulk region 95 and a second isolation region 97 of the NMOS transistor. Meanwhile, oxide layers 61 and 62 are formed on the gate electrodes 51 and 52.

Figure 4F:
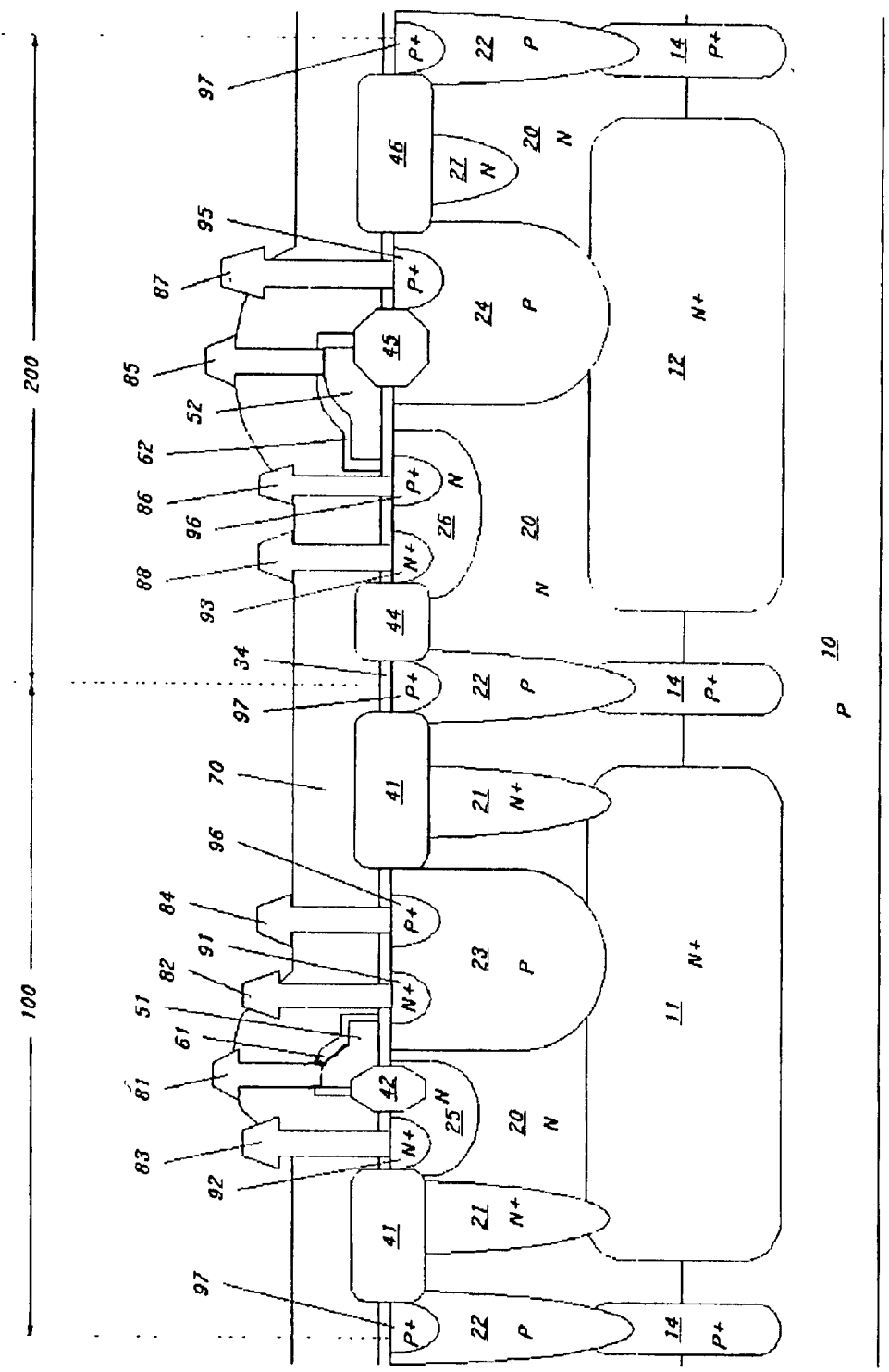

As shown in FIG. 4f, an insulating layer 70 is deposited on the whole surface of the substrate and patterned together with the oxides 34, 61 and 62 to form contact holes. A conductive layer is deposited and patterned to form gate, source, drain and bulk electrodes 81, 82, 83 and 84 of the NMOS transistor, and gate, source, drain and bulk electrodes 85, 86, 87 and 88 of the PMOS transistor.

As described above, the present invention provides an N-type sink region at the edge of the NMOS region to prevent parasitic operation of the NMOS transistor and has a twin-well structure in order to maintain a high withstand voltage between the NMOS and PMOS transistors.

While this invention has been described in connection with what is presently considered to be the most practical and preferred embodiment, it is to be understood that the invention is not limited to the disclosed embodiments, but, on the contrary, is intended to cover various modifications and equivalent arrangements included within the spirit and scope of the appended claims.

What is claimed is:

1. A method for fabricating a MOS transistor comprising:

forming a buried layer of a second conductivity type and a base layer of a first conductivity type on a semiconductor substrate of the first conductivity type;

growing a semiconductor layer on the semiconductor substrate;

forming a sink region of the second conductivity type in a portion of the semiconductor layer;

forming a first well of the first conductivity type in a portion of the semiconductor layer overlying the buried layer and a first isolation region of the first conductivity type in a portion of the semiconductor layer overlying the base layer;

forming a second well of the second conductivity type in a portion of the semiconductor layer;

forming a device isolating oxide layer on the semiconductor layer, wherein the sink region is disposed under the device isolating oxide layer;

forming a gate oxide layer and a gate electrode on the semiconductor layer; and forming source and drain regions in the first and second wells, respectively.

2. A method according to claim 1 wherein forming the sink region comprises implanting impurities of the second conductivity type in a portion of the semiconductor layer.

3. A method according to claim 1 wherein forming the first well comprises implanting impurities of the first conductivity type in the portion of the semiconductor layer overlying the buried layer.

4. A method according to claim 1 wherein forming the first isolation region comprises implanting impurities of the first conductivity type in the portion of the semiconductor layer overlying the base layer.

5. A method according to claim 1 wherein forming the second well comprises implanting impurities of the second conductivity type in a portion of the semiconductor layer.

6. A method according to claim 1 wherein forming the source and drain regions comprises implanting impurities of the second conductivity type in the first and second wells, respectively.

* * * * *